United States Patent
Rand et al.

(10) Patent No.: US 10,468,615 B2
(45) Date of Patent: Nov. 5, 2019

(54) ORGANIC PHOTOVOLTAIC CELLS WITH ENHANCED PHOTOCURRENT

(71) Applicants: IMEC VZW, Leuven (BE); Katholieke Universiteit Leuven, Leuven (BE)

(72) Inventors: Barry Rand, Princeton, NJ (US); Kjell Cnops, Leuven (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 86 days.

(21) Appl. No.: 15/004,724

(22) Filed: Jan. 22, 2016

(65) Prior Publication Data
US 2016/0181558 A1 Jun. 23, 2016

Related U.S. Application Data

(63) Continuation of application No. PCT/EP2014/065549, filed on Jul. 18, 2014.

(30) Foreign Application Priority Data

Jul. 24, 2013 (EP) ..................................... 13177733

(51) Int. Cl.
*H01L 51/42* (2006.01)
*H01L 51/44* (2006.01)
*H01L 51/00* (2006.01)

(52) U.S. Cl.
CPC ........ *H01L 51/4246* (2013.01); *H01L 51/441* (2013.01); *H01L 51/0055* (2013.01);
(Continued)

(58) Field of Classification Search
CPC ............................................. H01L 51/42–448
See application file for complete search history.

(56) References Cited

U.S. PATENT DOCUMENTS

2007/0096085 A1  5/2007 Rand et al.
2010/0175747 A1*  7/2010 Segato ................... B82Y 10/00
                                                    136/256

FOREIGN PATENT DOCUMENTS

WO    WO 2015/011060 A1   1/2015

OTHER PUBLICATIONS

Sakurai et al. "Structural control of organic solar cells based on nonplanar metallophthalocyanine/C60 heterojunctions using organic buffer layers" Organic Electronics 12 (2011) 966-973 (Year: 2011).*

(Continued)

*Primary Examiner* — Magali P Slawski
(74) *Attorney, Agent, or Firm* — Knobbe, Martens, Olson & Bear LLP

(57) ABSTRACT

The disclosure relates to organic photovoltaic cells comprising a heterojunction structure formed by a first organic donor layer and a first organic acceptor layer, and further comprising a second organic acceptor layer adjacent to the first organic acceptor layer and/or a second organic donor layer adjacent to the first organic donor layer. The materials of the first acceptor layer and the second acceptor layer are selected to allow exciton dissociation by charge transfer at their interface, and to simultaneously allow exciton energy transfer at their interface. The materials of the first donor layer and the second donor layer are selected to allow exciton dissociation by charge transfer at their interface, and to simultaneously allow exciton energy transfer at their interface. Organic photovoltaic cells of the present invention may have a high short-circuit current density, a good open-circuit voltage and a good fill factor.

5 Claims, 5 Drawing Sheets

(52) U.S. Cl.
CPC ...... *H01L 51/0068* (2013.01); *H01L 51/0077* (2013.01); *H01L 51/0078* (2013.01); *Y02E 10/549* (2013.01)

(56) References Cited

OTHER PUBLICATIONS

United States Patent and Trademark Office (USPTO) "Precedential and informative decisions" (Year: 2018).*
Cnops et al. "Subphthalocyanines as effective donors and acceptors in high-efficiency organic solar cells"; Hybrid and Organic Photovoltaics Conference (HOPV 2013); May 5-8, 2013; Seville, Spain.
Cnops et al., "Subphthalocyanines as Versatile Donors and Acceptors in High-efficiency Organic Solar Cells (abstract)," 2013 MRS Spring Meeting and Exhibition, Symposium B: Organic and Hybrid Photovoltaic Materials and Devices, Apr. 3, 2013.
Cnops et al., "Subphthalocyanines as Versatile Donors and Acceptors in High-efficiency Organic Solar Cells (Poster),"(May 29, 2013) IMEC.
Hong, et al., "Antenna effects and improved efficiency in multiple heterojunction photovoltaic cells based on pentacene, zinc phthalocyanine, and $C_{603}$" Journal of Applied Physics 106 (2009), p. 064511-1-6.
Ichikawa et al., "Cascade-type excitation energy relay in organic thin-film solar cells," Organic Electronics 14(2013), p. 814-820.
Ichikawa et al., "Sensitization of organic photovoltaic cells based on interlayer excitation energy transfer," Organic Electronics 11(2010), p. 700-704.
International Search Report and Written Opinion dated Sep. 26, 2014 issued for International Patent Application No. PCT/EP2014/065549.
Clarke et al., "Charge Photogeneration in Organic Solar Cells", Chem. Rev. 2010, vol. 110, pp. 6736-6767.
Clarke et al., "Charge Photogeneration in Organic Solar Cells", Chem. Rev., vol. 110, pp. 6736-6767, 2010.

* cited by examiner

D1　　A1　　A2

D1　　A1　　A2

ORGANIC PHOTOVOLTAIC CELLS WITH ENHANCED PHOTOCURRENT

CROSS-REFERENCE TO RELATED APPLICATIONS

This application is a continuation of PCT Application No. PCT/EP2014/065549, filed on Jul. 18, 2014, which claims priority to European application EP 13177733.6, filed on Jul. 24, 2013. Each of the above applications is incorporated herein by reference in its entirety.

BACKGROUND

Field

The disclosed technology generally relates to photovoltaic cells, and more particularly to organic photovoltaic cells.

Description of the Related Technology

A typical active layer stack of a conventional organic photovoltaic (OPV) devices has two organic semiconductor layers: an electron acceptor layer containing organic molecules with a low electron affinity (or a relatively low lowest unoccupied molecular orbital (LUMO) energy level) and a low ionization potential (or a relatively low highest occupied molecular orbital (HOMO) energy level), and an electron acceptor layer containing organic molecules with a higher LUMO energy level and a higher HOMO energy level than the acceptor layer. The active layer stack, which is typically 50 nm to 100 nm thick, is sandwiched between two electrodes. Often a buffer layer is provided between the active layer stack and the electrodes, for avoiding direct contact between the active layer and the electrodes. Upon absorption of light in the donor layer or in the acceptor layer excitons are created. As described herein, an exciton refers to an electrically neutral paired state of an electron and a hole. Once created in the donor layer or the acceptor layer, some excitons may diffuse to the donor/acceptor interface, where they may dissociate into free charges (i.e., free electrons and free holes). After dissociation, the electrons are collected at a cathode and the holes are collected at an anode.

The photocurrent generated in typical OPV cells is often limited by the narrow absorption bandwidth of most organic molecules (or polymers). Only photons in a small spectral range may create excitons in either the donor or the acceptor layer. A broader absorption spectrum would lead to a higher photocurrent, and consequently to a higher power conversion efficiency.

In one approach for broadening the absorption spectrum of organic photovoltaic cells, two or more organic cells are stacked, wherein the different cells in the stack have different active layer stacks with a different absorption spectrum. A part of the incoming light that is not absorbed in the upper cell may be further transmitted to an underlying cell, where part of this transmitted light may be absorbed. Such a configuration (also called 'tandem cell' or 'multi-junction cell') corresponds to a series connection of two 2 or more cells. For this kind of cell structures, it is a challenge to provide power matching (e.g. current matching) between the different cells in the stack. Also, the layer stack required for efficient multi-junction devices may be rather complex.

In another approach, two donor/acceptor heterojunctions are stacked and connected in series (three-layer cascade organic cell), to enhance photocurrent for organic photovoltaic cells. This is for example reported by K. Cnops et al in "Enhanced photocurrent and open-circuit voltage in 3-layer cascade organic solar cell", Applied Physics Letters 101, 143301 (2012). A three-layered structure is described, wherein subphthalocyanine (SubPc) acts as an ambipolar interlayer between a tetracene (Tc) donor layer and a C60 acceptor layer. The Tc/SubPc and the SubPc/C60 interfaces are both able to contribute to the photocurrent. Excitons may be dissociated at both heterojunctions, and charges may be extracted through the cascade structure of energy levels. This results in an enhanced photocurrent. However, the presence of the ambipolar interlayer results in a reduced fill factor. In addition, the open-circuit voltage Voc is reduced as compared to the open-circuit voltage of a two-layer Tc/SubPc device and as compared to the open-circuit voltage of a two-layer SubPc/C60 device. This loss in Voc is related to the cascade structure of energy levels.

In "Sensitization of organic photovoltaic cells based on interlayer excitation energy transfer", Organic Electronics 11 (2010) 700-704, M. Ichikawa et al. describe still another approach for increasing the short-circuit current density of organic photovoltaic cells. An additional p-type organic semiconductor layer (APL) is introduced into organic photovoltaic cells that have a single p/n junction formed by an indispensable p-type layer (IPL) and an n-type layer (NL), wherein the APL has a larger band gap than the IPL and wherein excitons generated by optical absorption in the APL may be transferred to the IPL, resulting in the creation of additional excitons in this layer. These transferred excitons separate into charge carriers at the p/n junction, which results in an increased short-circuit current density as compared to cells without APL.

SUMMARY OF CERTAIN INVENTIVE ASPECTS

The present disclosure aims to provide organic photovoltaic cells with an active layer stack containing an electron donor layer, an electron acceptor layer and at least one additional layer that contributes to an enhanced cell performance, and wherein at least one or more of the disadvantages of the prior art are avoided or reduced.

An organic photovoltaic cell according to an embodiment of the present disclosure comprises a heterojunction structure formed by a first organic donor layer and a first organic acceptor layer, and further comprises a second acceptor layer adjacent to the first acceptor layer, the first organic acceptor layer having a first optical band gap and a first LUMO level and the second organic acceptor layer having a second optical band gap and a second LUMO level. In various embodiments of the present disclosure, the second optical band gap is at least 0.1 eV larger than the first optical band gap, the difference between the first LUMO level and the second LUMO level is not larger than 0.1 eV; an optical emission spectrum of the second acceptor layer overlaps with an optical absorption spectrum of the first acceptor layer, and the charge-transfer state energy at the interface between the first acceptor layer and the second acceptor layer is smaller than the triplet state energy of the first acceptor layer and/or the second acceptor layer.

In another embodiment, an organic photovoltaic cell of the present disclosure comprises a heterojunction structure formed by a first organic donor layer and a first organic acceptor layer, and further comprises a second donor layer adjacent to the first donor layer, the first organic donor layer having a third optical band gap and a first HOMO level and the second organic donor layer having a fourth optical band gap and a second HOMO level. In embodiments of the present disclosure, the fourth optical band gap is at least 0.1 eV larger than the third optical band gap, the difference between the first HOMO level and the second HOMO level is not larger than 0.1 eV, an optical emission spectrum of the second donor layer overlaps with an optical absorption spectrum of the first donor layer, and the charge-transfer state energy at the interface between the first donor layer and the second donor layer is smaller than the triplet state energy of the first donor layer and/or the second donor layer.

In embodiments of the present disclosure, an organic photovoltaic cell may comprise a heterojunction structure formed by a first organic donor layer and a first organic acceptor layer, and further a second acceptor layer adjacent to the first acceptor layer as described above and a second donor layer adjacent to the first donor layer as described above.

The heterojunction between the first organic donor layer and the first organic acceptor layer may be a discrete heterojunction, wherein the first donor layer and the first acceptor layer form a stack of layers. In other embodiments, the heterojunction between the first organic donor layer and the first organic acceptor layer may be a bulk heterojunction, wherein the first donor layer and the first acceptor layer are intermingled.

In a photovoltaic cell according to embodiments of the present disclosure, incident light may be absorbed in the first donor layer, the first acceptor layer, the second donor layer and/or the second acceptor layer, resulting in the formation of excitons in these layers. Excitons generated in the first acceptor layer or in the first donor layer may dissociate at the heterojunction interface between the first donor layer and the first acceptor layer. Excitons generated in the second acceptor layer (in the second donor layer) may either dissociate at the interface with the first acceptor layer (first donor layer) by charge transfer, or they may be transferred to the first acceptor layer (first donor layer) and then dissociate at the heterojunction interface between the first donor layer and the first acceptor layer.

The dissociation of excitons leads to the formation of free charge carriers that can be collected at the cell contacts and thus contribute to the photocurrent. In embodiments of the present disclosure, free charge carriers are not only generated at the interface between the first donor layer and the first acceptor layer but also at the interface between the second acceptor layer and the first acceptor layer and/or at the interface between the second donor layer and the first donor layer.

In embodiments of the present disclosure, the thickness of the first acceptor layer is preferably smaller than the exciton diffusion length in the first acceptor layer, and the thickness of the first donor layer is preferably smaller than the exciton diffusion length in the first donor layer. In embodiments wherein the junction between the first acceptor layer and the first donor layer is a bulk heterojunction, the size of the different domains is preferably smaller than the corresponding exciton diffusion length.

It is an advantage of organic photovoltaic cells of embodiments of the present disclosure that they allow generating a large photocurrent, due to the presence of multiple exciton dissociation mechanisms as described above.

It is an advantage of organic photovoltaic cells of embodiments of the present disclosure that they can have a good fill factor.

It is an advantage of organic photovoltaic cells of embodiments of the present disclosure, as compared to tandem cells or multi-junction cells, that there is no need for providing power matching between different cells. It is an advantage of organic photovoltaic cells of embodiments of the present disclosure, as compared to cascade cells, that they may have a better fill factor and that there is a lower loss in open-circuit voltage. This lower Voc loss is related to the small difference (less than 0.1 eV) between the LUMO level of the first acceptor layer material and the LUMO level of the second acceptor layer material and/or the small difference (less than 0.1 eV) between the HOMO level of the first donor layer material and the HOMO level of the second donor layer material.

Particular aspects of the invention are set out in the accompanying claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the disclosure. 6 The disclosure, both as to organization and method of operation, together with features and advantages thereof, may best be understood by reference to the following detailed description when read in conjunction with the accompanying drawings.

BRIEF DESCRIPTION OF THE DRAWINGS

FIG. 3(a) illustrates energy transfer from A2 to A1; FIG. 3(b) illustrates charge transfer at the A1/D1 interface.

and with an α-6T/SubNc/SubPc active layer (dash-dot line) according to an embodiment of the present disclosure.

Figure 9:
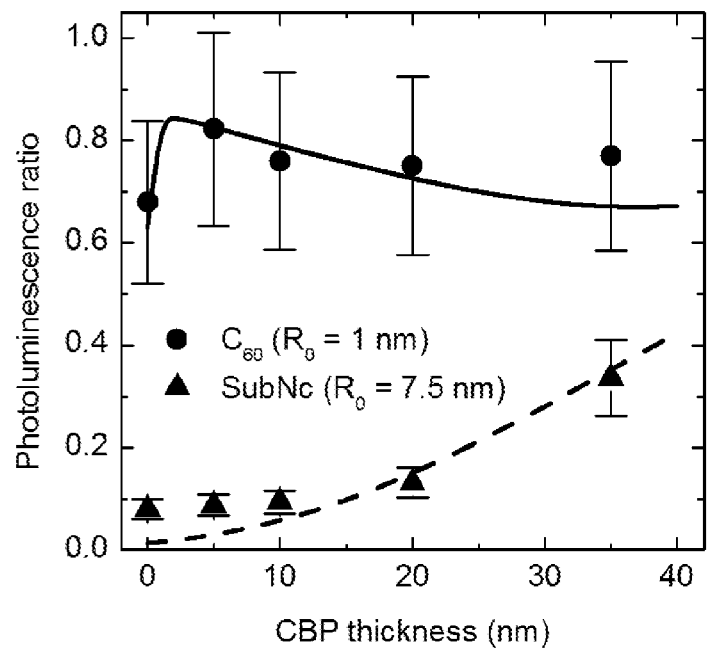

FIG. 9 shows the measured photoluminescence ratio of: a thin film structure consisting of a 20 nm SubPc layer, a 4,4'-Bis(N-carbazolyl)-1,1'-biphenyl (CBP) spacer layer with varying thickness, and a 10 nm SubNc quenching layer (triangles), as a function of CBP thickness; and of a thin film structure consisting of a 20 nm SubPc layer, a 4,4'-Bis(N-carbazolyl)-1,1'-biphenyl (CBP) spacer layer with varying thickness, and a 10 nm C60 quenching layer (circles), as a function of CBP thickness. In addition, FIG. 9 shows the results of numerical modeling for these structures (dashed line and full line).

Any reference signs in the claims shall not be construed as limiting the scope of the present disclosure.

In the different drawings, the same reference signs refer to the same or analogous elements.

DETAILED DESCRIPTION OF CERTAIN ILLUSTRATIVE EMBODIMENTS

In the following detailed description, numerous specific details are set forth in order to provide a thorough understanding of the disclosure and how it may be practiced in particular embodiments. However, it will be understood that the disclosed technology may be practiced without these specific details. In other instances, well-known methods, procedures and techniques have not been described in detail, so as not to obscure the present disclosure.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure may operate in other sequences than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

The present disclosure relates to organic photovoltaic cells with an active layer stack comprising an electron donor layer, an electron acceptor layer and at least one additional layer, wherein the at least one additional layer leads to a broadening of the absorption spectrum resulting in a photocurrent that is higher than in conventional organic photovoltaic cells.

An organic photovoltaic cell according to various embodiments comprises a heterojunction structure formed by a first donor layer (electron donor layer) and a first acceptor layer (electron accepting layer). In various embodiments, the first donor layer and the first acceptor layer are in direct contact with each other to form the heterojunction. However, it will be appreciated that embodiments of the present disclosure could be combined with other techniques for increasing the photocurrent, e.g. replacing the heterojunction between the first donor layer and the first acceptor layer by a three-layer cascade as described in the background section or by a sequence of junctions, without influencing the applicability of the features of embodiments of the present disclosure. Nevertheless, for the sake of clarity, the present disclosure describes the embodiments with reference to a single heterojunction between the first donor layer and the first acceptor layer. An organic cell of the present disclosure further comprises a second acceptor layer adjacent to the first acceptor layer and/or a second donor layer adjacent to the first donor layer.

The active layer stack of an organic photovoltaic cell according to various embodiments may thus include three or four organic layers. In a first embodiment of the present, the active layer stack comprises a first donor layer (D1), a first acceptor layer (A1) and a second acceptor layer (A2). In some implementations, the layers of the active layer stack are sequentially stacked to have a first donor layer (D1), a first acceptor layer (A1) on the first donor layer (D1) and a second acceptor layer (A2) on the first acceptor layer (A1), wherein each layer has properties described in detail infra.

In a second embodiment, the active layer stack contains a first acceptor layer (A1), a first donor layer (D1) and a second donor layer (D2). In some implementations, the layers of the active layer stack are sequentially stacked to have a first acceptor layer (A1), a first donor layer (D1) formed on the first acceptor layer (A1) and a second donor layer (D2) formed on the first donor layer (D1), wherein each layer has properties described in detail infra.

In a third embodiment, the active layer stack contains a second donor layer (D2), a first donor layer (D1), a first acceptor layer (A1) and a second acceptor layer (A2). In some implementations, the layers of the active layer stack are sequentially formed to have a second donor layer (D2), a first donor layer (D1) formed on the second donor layer (D2), a first acceptor layer (A1) formed on the first donor layer (D1) and a second acceptor layer (A2) formed on the first acceptor layer (A1), wherein each layer has properties described in detail infra.

In various embodiments, each successive layer of the stacks D1/A1/A2, D2/D1/A1 and D2/D1/A1/A2 may be directly formed on a corresponding previous layer. In other embodiments there may be an intervening layer between each successive layer and the corresponding previous layer.

In the following, while a reference may be made to both the second acceptor layer and the second donor layer, it will be understood from the above description of different embodiments that only one of the second acceptor layer (A2) or the second donor layer (D2) may be present, while the other is omitted.

In embodiments of the present disclosure, the first acceptor layer (A1) and the second acceptor layer (A2) have the following properties: the optical band gap of A2 is larger than the optical band gap of A1, the difference between the optical band gap of A1 and the optical band gap of A2 being at least 0.1 eV, preferably larger than 0.3 eV; the difference between the LUMO level of A1 and the LUMO level of A2 is not larger than 0.1 eV; the optical emission spectrum of A2 overlaps with the optical absorption spectrum of A1; and the charge-transfer state energy at the A1/A2 interface is smaller than the triplet state energy/energies of either/both of A1 or/and A2.

In embodiments of the present disclosure, the first donor layer (D1) and the second donor layer (D2) have the following properties: the optical band gap of D2 is larger than the optical band gap of D1, the difference between the optical band gap of D1 and the optical band gap of D2 being at least 0.1 eV, preferably larger than 0.3 eV; the difference between the HOMO level of D1 and the HOMO level of D2 is not larger than 0.1 eV; the optical emission spectrum of D2 overlaps with the optical absorption spectrum of D1; and the charge-transfer state energy at the D1/D2 interface is smaller than the triplet state energy/energies of either/both of D1 or/and D2.

Figure 1:
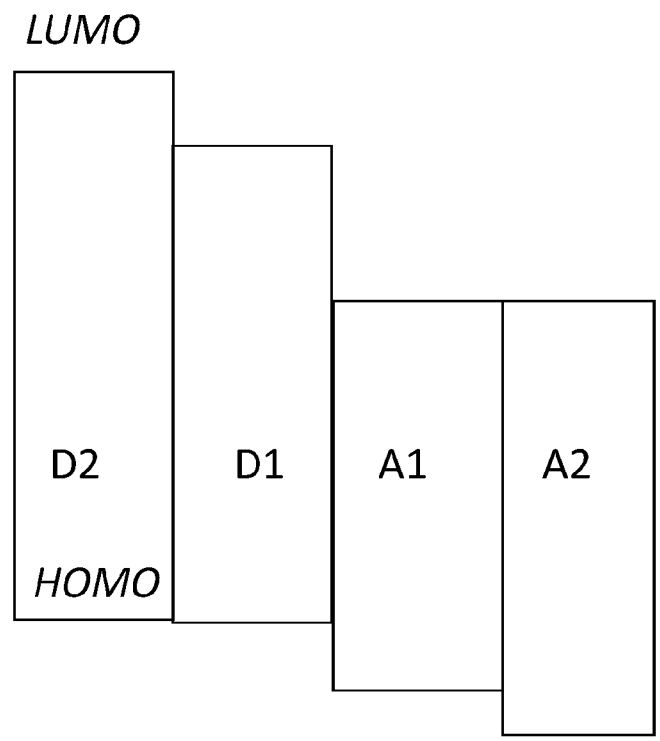
FIG. 1 schematically illustrates an energy band diagram of the active layer stack of an organic photovoltaic cell in accordance with an embodiment of the present disclosure, the active layer stack comprising a second donor layer D2, a first donor layer D1, a first acceptor layer A1 and a second acceptor layer A2.

FIG. 1 schematically illustrates an energy band diagram of the active layer stack of an organic photovoltaic cell in accordance with the present disclosure, the active layer stack containing a stack of a second donor layer D2, a first donor layer D1, a first acceptor layer A1 and a second acceptor layer A2.[0042] In the following, operational principles of various embodiments of a photovoltaic cell are described, without being bound to any theory. In various embodiments, incident light may be absorbed in the first donor layer, the first acceptor layer, the second donor layer and/or the second acceptor layer.

Light absorbed in the first donor layer or in the first acceptor layer leads to the formation of excitons in these layers. These excitons may then be dissociated at the A1/D1 interface into free holes and electrons, which may be collected at the cell contacts (anode and cathode), and thus contribute to the photocurrent.

Light absorbed in the second donor layer or in the second acceptor layer also leads to the formation of excitons in these layers. In order to produce a photocurrent from this absorption, the generated excitons need to be dissociated at a heterojunction. In embodiments of the present disclosure, two separate mechanisms may act simultaneously.

Figure 2:
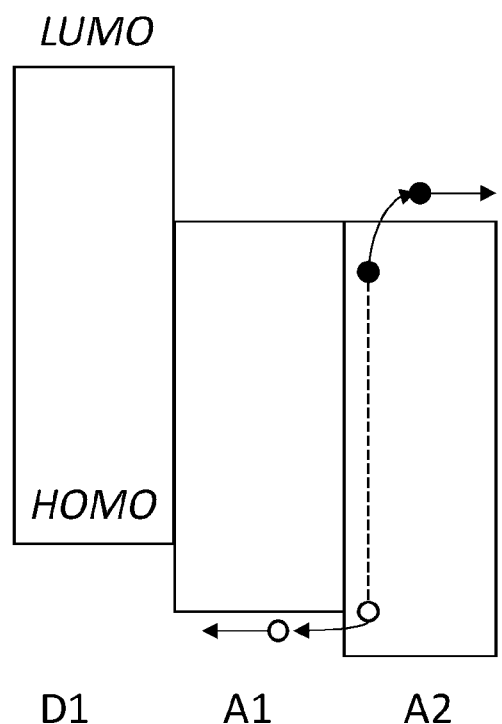
FIG. 2 schematically illustrates the charge transfer mechanism at the A1/A2-interface in an organic photovoltaic cell according to an embodiment of the present disclosure.

In a first mechanism, without being bound to any theory, excitons generated in the second acceptor layer A2 may diffuse to the interface with the first acceptor layer A1, and dissociate at the A1/A2-interface by charge transfer, resulting in free electrons and free holes. The free electrons may remain in the A2 layer and travel to the cathode. The free holes may be transferred to the A1 layer, where they travel to the donor layers, and further to the anode. This first mechanism is schematically illustrated in FIG. 2 for an embodiment wherein the active layer stack contains a first donor layer, a first acceptor layer and a second acceptor layer. In FIG. 2, holes are represented by open circles, and electrons are represented by filled circles.

Similarly, in the first mechanism, excitons generated in the second donor layer D2 may diffuse to the interface with the first donor layer D1, and these excitons dissociate at the D1/D2-interface by charge transfer, resulting in free electrons and free holes. The free holes may remain in the D2 layer and travel to the anode. The free electrons are transferred to the D1 layer, where they travel to the acceptor layers, and further to the cathode.

Figure 3A:
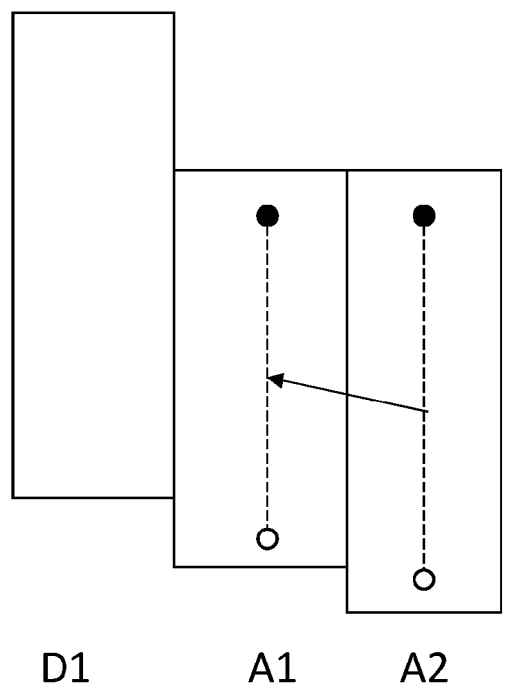
FIGS. 3(a) and 3(b) schematically illustrates the two-step energy and charge transfer mechanism from A2 to D1 in an organic photovoltaic cell according to an embodiment of the present disclosure.
Figure 3B:
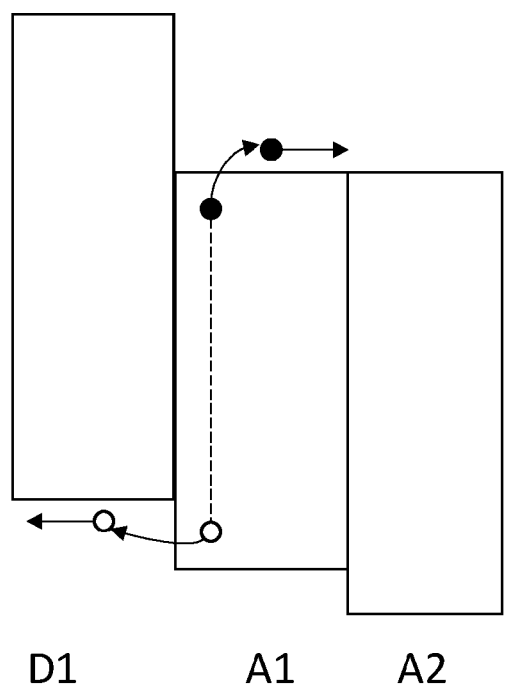

In a second mechanism, without being bound to any theory, excitons generated in the second acceptor layer may first be transferred to the first acceptor layer by resonant energy transfer, e.g. by long-range Forster resonance energy transfer (FRET). Next the transferred excitons may diffuse to the D1/A1 interface and dissociate at the D1/A1-interface by charge transfer. The free electrons travel through the acceptor layers to the cathode. The free holes travel through the donor layers to the anode. This second, two-step mechanism is schematically illustrated in FIG. 3(a) (first step: energy transfer A2/A1) and FIG. 3(b) (second step: charge transfer A1/D1) for an embodiment wherein the active layer stack contains a first donor layer, a first acceptor layer and a second acceptor layer. In FIG. 3, holes are represented by open circles, and electrons are represented by filled circles. Similarly, in the second mechanism, excitons generated in the second donor layer are transferred to the first donor layer by resonant energy transfer, e.g. by long-range Forster resonance energy transfer (FRET). Next the transferred excitons dissociate at the D1/A1-interface by charge transfer. The free electrons travel through the acceptor layers to the cathode. The free holes travel through the donor layers to the anode. In embodiments of the present disclosure, the first acceptor layer: (1) acts as an energy acceptor for excitons from the second acceptor layer; and (2) acts as a charge acceptor for excitons from the second acceptor layer and from the donor layers.

In embodiments of the present disclosure, the first donor layer: (1) acts as an energy acceptor for excitons from the second donor layer; and (2) acts as a charge acceptor for excitons from the second donor layer and from the acceptor layers.

This simultaneous action of the first mechanism (charge transfer) and the second mechanism (energy transfer followed by charge transfer) is obtained by a proper selection of the different materials, as described above. In a device of the present disclosure, long-range energy transfer is exploited to bring excitons generated in the second acceptor layer or in the second donor layer more efficiently to an active heterojunction. The specific choice of materials allows charge transfer at the A1/A2-interface and/or at the D1/D2 interface, and charge extraction to the electrodes. The additional charge generation mechanisms thus increase the photocurrent produced by the OPV cell.

In a photovoltaic cell of the present disclosure, not only the A1/D1 interface but also the A1/A2 interface and/or the D1/D2 interface are active interfaces, i.e. photocurrent producing interfaces. In order to enable charge transfer at the A1/A2 interface (respectively at the D1/D2 interface), the charge-transfer state energy at this interface is less than the triplet state energy of either A1 or A2 (respectively either D1 or D2). These energy levels may be determined based on a combination of optical spectroscopy and electron spectroscopy. In addition, there is a minimum threshold for the offset of HOMO energy levels at the A1/A2 interface (respectively the LUMO energy levels at the D1/D2 interface) to allow charge transfer. This minimum threshold is at least 0.1 eV, preferably at least 0.2 eV, preferably at least 0.3 eV.

By way of illustration, embodiments of the present disclosure not being limited thereto, experimental results will now be discussed.

Organic photovoltaic cells having a first donor layer, a first acceptor layer and a second acceptor layer in accordance with the first embodiment of the present disclosure have been fabricated.

The devices were fabricated on glass substrates coated with a pre-patterned indium tin oxide layer (anode). A 20 nm thick layer of poly(3,4-ethylenedioxythiophene): poly(styrenesulfonate) (PEDOT:PSS) was spin coated on the substrate. Next, purified organic materials were deposited in a high-vacuum evaporation chamber at a rate of 0.1 nm/s in the following sequence: 60 nm alpha-sexithiophene (α-6T), 12 nm boron subnaphthalocyanine chloride (SubNc), 18 nm boron subphthalocyanine chloride (SubPc), 7 nm bathocuproine (BCP). Then a 120 nm thick Ag cathode was evaporated at a rate of 0.3 nm/s through a shadow mask, thereby defining an active device area of 13.4 mm$^2$.

Figure 4:
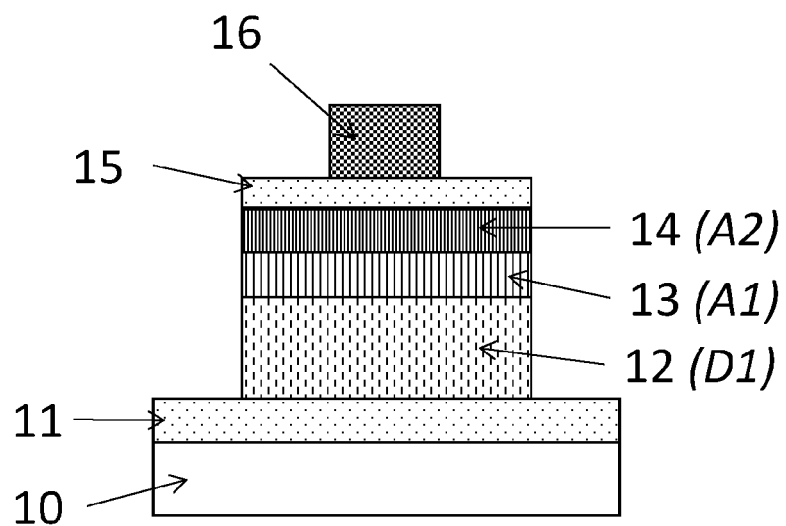
FIG. 4 schematically illustrates the layer stack of an organic photovoltaic cell that was fabricated in accordance with an embodiment of the present disclosure.
Figure 5:
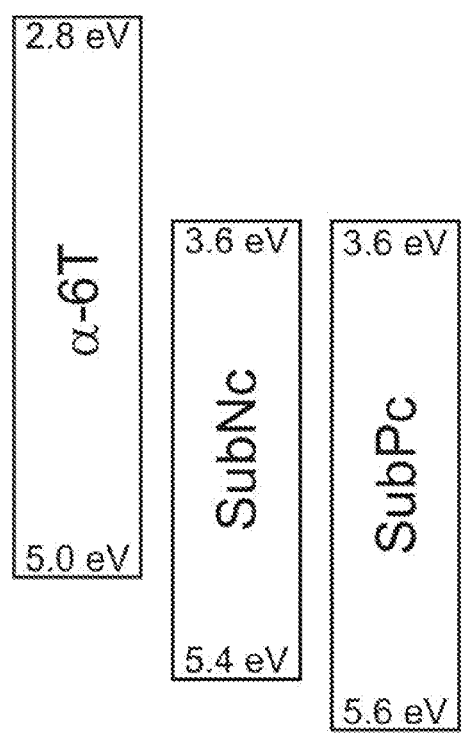
FIG. 5 shows the energy band diagram of materials used for fabricating an organic photovoltaic cell in accordance with an embodiment of the present disclosure.

The resulting device structure is schematically shown in FIG. 4. In the experiments, α-6T was used as a material for forming the first donor layer 12, SubNc was used for the first acceptor layer 13 and SubPc was used for the second acceptor layer 14. In FIG. 4 furthermore buffer layers 11 (PEDOT:PSS) and 15 (BCP) are shown, as well as contact 16 (Ag cathode) and glass substrate 10. The glass substrate 10 is coated with a patterned indium tin oxide layer (anode, not shown in FIG. 4) that is transparent for incident radiation. The energy band diagram is shown in FIG. 5, and the HOMO and LUMO energy levels of these three materials are shown in Table 1.

TABLE 1

| Material | HOMO level | LUMO level |
|---|---|---|
| α-6T | 5.0 eV | 2.8 eV |
| SubNc (A1) | 5.4 eV | 3.6 eV |
| SubPc (A2) | 5.6 eV | 3.6 eV |

Figure 6:
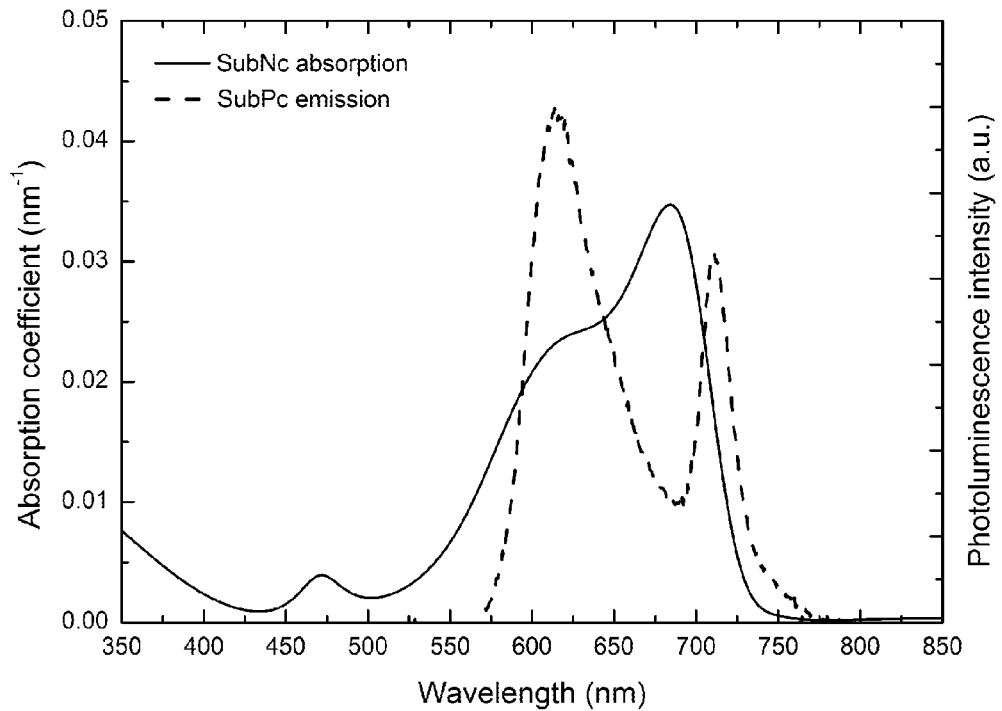
FIG. 6 shows the emission spectrum of SubPc (dashed line) and the absorption spectrum of SubNc (full line), illustrating features used in an embodiment of the present disclosure.

For this material combination: the optical band gap of second acceptor layer SubPc is larger than the optical band gap of first acceptor layer SubNc, the difference being 0.2 eV; the SubNc LUMO level and the SubPc LUMO level are substantially equal; and the optical emission spectrum of SubPc overlaps with the optical absorption spectrum of SubNc. This is illustrated in FIG. 6, showing the emission spectrum of SubPc (dashed line) and the absorption spectrum of SubNc (full line). Furthermore, the charge transfer state energy at the SubNc/SubPc interface is smaller than the triplet state energy of both SubNc and SubPc.

Figure 7:
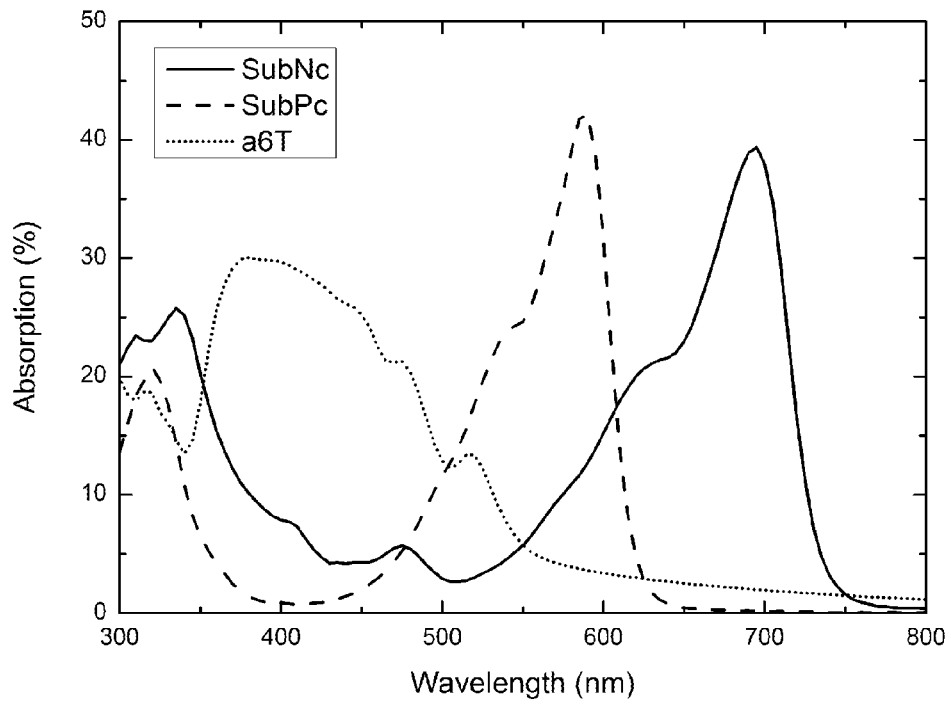
FIG. 7 shows the absorption as a function of wavelength for SubNc (full line), SubPc (dashed line) and α-6T (dotted line), illustrating features used in an embodiment of the present disclosure.

FIG. 7 shows the absorption as a function of wavelength for these three materials. The absorption spectra complement each other and thus effectively broaden the range of the solar spectrum that may be absorbed and that may contribute to the generation of a photocurrent.

As a reference, also photovoltaic cells with a known donor/acceptor layer structure were made, wherein a 60 nm thick α-6T layer was used as a donor layer and wherein either 15 nm SubPc or 20 nm SubNc was used as an acceptor layer material. The cell size was 13.4 mm². The current-voltage characteristics were measured under AM1.5 illumination. Table 2 shows the measured open-circuit voltage Voc, short-circuit 14 current density Jsc, fill factor FF and power conversion efficiency PCE for the two types of reference cells (α-6T/SubPc and α-6T/SubNc) and for the cell in accordance with an embodiments of the present disclosure (α-6T/SubNc/SubPc).

TABLE 2

| | Voc [V] | Jsc [mA/cm2] | FF [%] | PCE [%] |
|---|---|---|---|---|
| α-6T/SubPc | 1.09 | 7.46 | 57.1 | 4.65 |
| α-6T/SubNc | 0.94 | 11.94 | 53.2 | 5.97 |
| α-6T/SubNc/SubPc | 0.96 | 14.55 | 61.0 | 8.40 |

From the results shown in Table 2, it may be concluded that a three-layer device according to the present disclosure produces a larger photocurrent (larger short-circuit current density Jsc) as compared to the reference bilayer devices with an α-6T/SubPc or an α-6T/SubNc active layer stack. In the three-layer device, both acceptor layers may contribute to the photocurrent. The open-circuit voltage Voc of the three-layer device of the present disclosure is in the same order as the open-circuit voltage of the α-6T/SubNc device.

Figure 8:
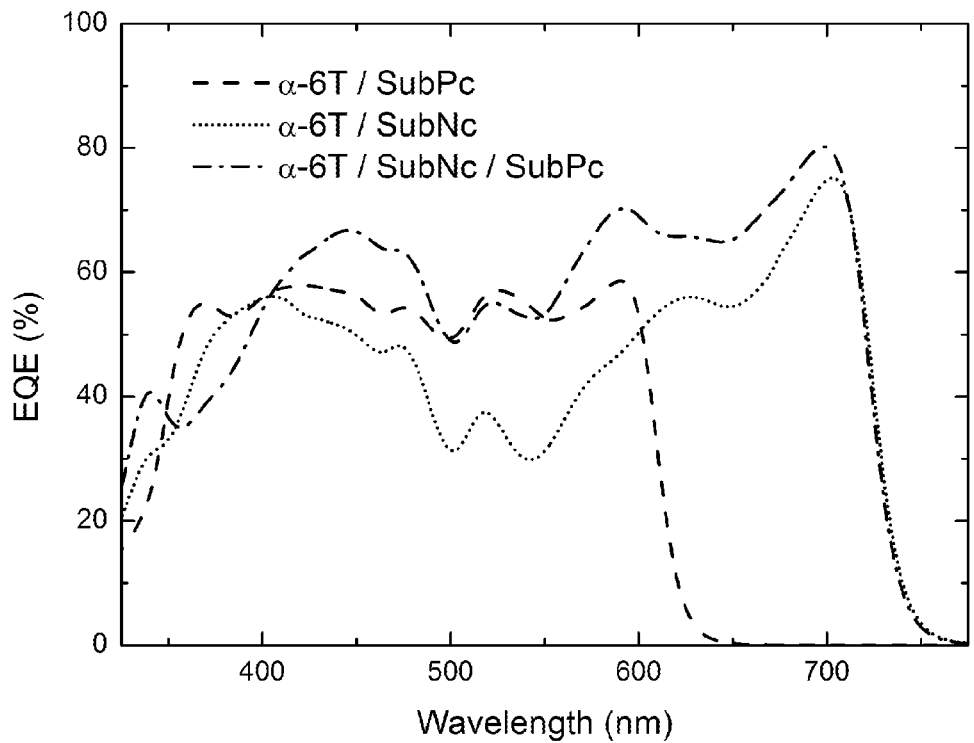
FIG. 8 shows the measured external quantum efficiency of organic photovoltaic cells: with an α-6T/SubPc active layer (dashed line); with an α-6T/SubNc active layer (dotted line)

FIG. 8 shows the measured external quantum efficiency of these three different types of organic photovoltaic cells: with an α-6T/SubPc active layer (dashed line); with an α-6T/SubNc active layer (dotted line); and with an α-6T/SubNc/SubPc active layer (dash-dot line) according to an embodiment of the present disclosure. From these measurements it may be concluded that the SubPc layer contributes to the photocurrent in a device according to the present disclosure.

In order to study the significance of the two-step exciton dissociation mechanism in the three-layer α-6T/SubNc/SubPc device of the present disclosure, the efficiency of Forster resonance energy transfer from SubPc to SubNc was investigated by a set of photoluminescence quenching experiments. FIG. 9 shows the photoluminescence ratio (i.e. the ratio of the photoluminescence intensity with quenching layer to the photoluminescence intensity without quenching layer) of a thin film structure consisting of a 20 nm SubPc layer, a 4,4'-Bis(N-carbazolyl)-1,1'-biphenyl (CBP) spacer layer with varying thickness, and a 10 nm SubNc quenching layer (triangles); and of a thin film structure consisting of a 20 nm SubPc layer, a 4,4'-Bis(N-carbazolyl)-1,1'-biphenyl (CBP) spacer layer with varying thickness, and a 10 nm C60 quenching layer (circles). Samples with a C60 quenching layer were used as reference or control structures. In such samples a negligible energy transfer is expected due to the limited overlap between C60 optical absorption spectrum and the SubPc optical emission spectrum. Quenching of the SubPc photoluminescence by SubNc indicates that long-range energy transfer from SubPc to SubNc is very efficient.

Numerical modeling of the experimental results (dashed lines and full lines in FIG. 9) allows for extraction of the Forster radius of energy transfer R0. For the samples with SubNc quenching layer, a Forster radius of energy transfer R0=7.5 nm was calculated, while for the samples with C60 quenching layer a Forster radius of energy transfer R0=1 nm was found.

When performing the experiments described above, it was observed that the α-6T layer had a rough surface. This roughness of the α-6T surface may have an advantageous effect on the performance of the photovoltaic cells. Due to the roughness of this first donor layer, the contact surface with the first acceptor layer is enlarged. As a result, a larger surface area is available where for example exciton dissociation may take place. In addition, the efficiency of Forster transfer may be improved due to the rough interface.

Although in the description above, the different donor and acceptor layers are described as stacked layers, the disclosed technology is not limited thereto. In embodiments of the present disclosure, the different layers may be intermingled. For example, the interface between the first donor layer and the first acceptor layer may also be a bulk heterojunction interface.

Although in the experiments described above, only a device structure with α-6T as a first donor layer, SubNc as a first acceptor layer and SubPc as a second acceptor layer are described in detail, the disclosed technology is not limited thereto and other material combinations may be used in embodiments of the disclosed technology. For example, the following D2/D1 material combinations may be used in embodiments comprising a first donor layer (D1) and a second donor layer (D2): α-6T/CuPc, α-6T/ZnPc, α-6T/PbPc, pentacene/CuPc, pentacene/ZnPc, pentacene/PbPc, the disclosed technology not being limited thereto. For example, the following A1/A2 material combinations may be used in embodiments comprising a first acceptor layer (A1) and a second acceptor layer (A2): ClAlPc/SubPc, ZnPc/SubPc, PbPc/SubPc, PbPc/SubNc and other combinations of (sub-)phthalocyanines. SubPc and SubNc may also be used as donor materials, for example in combination with rubrene.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the invention.

What is claimed is:

1. An organic photovoltaic cell, comprising:
a first organic donor layer and a first organic acceptor layer contacting the first organic donor layer to form a heterojunction; and
one or both of a second acceptor layer adjacent the first acceptor layer and a second donor layer adjacent the first donor layer,
wherein the organic photovoltaic cell comprises a stack including indium tin oxide (ITO)/poly(3,4-ethylenedioxythiophene):poly(styrenesulfonate)(PEDOT:PSS)/alpha-sexithiophene (α-6T)/subnaphthalocyanine chloride (SubNc)/subphthalocyanine chloride (SubPc)/bathocuproine (BCP)/Ag,
wherein when the second acceptor layer is present:
the second acceptor layer has an optical band gap that is greater than an optical band gap of the first acceptor layer by at least 0.1 eV,
the second acceptor layer has a lowest unoccupied molecular orbital (LUMO) energy that is within 0.1 eV of a LUMO energy of the first acceptor layer,
an optical emission spectrum of the second acceptor layer overlaps with an optical absorption spectrum of the first acceptor layer, and
a charge-transfer state energy at an interface between the first acceptor layer and the second acceptor layer is smaller than a triplet state energy of one or both of the first acceptor layer and the second acceptor layer, and
wherein when the second donor layer is present:
the second donor layer has an optical band gap that is greater than an optical band gap of the first donor layer by at least 0.1 eV,
the second donor layer has a highest occupied molecular orbital (HOMO) energy that is within 0.1 eV of a HOMO energy of the first donor layer,
an optical emission spectrum of the second donor layer overlaps with an optical absorption spectrum of the first donor layer, and
a charge-transfer state energy at an interface between the first donor layer and the second donor layer is smaller than a triplet state energy of one or both of the first donor layer and the second donor layer.

2. An organic photovoltaic cell, comprising:
a first organic donor layer and a first organic acceptor layer contacting the first organic donor layer to form a heterojunction, the first organic donor layer comprising alpha-sexithiophene; and
a second acceptor layer adjacent the first acceptor layer with or without a second donor layer adjacent the first donor layer,
wherein the second acceptor layer is such that:
the second acceptor layer has an optical band gap that is greater than an optical band gap of the first acceptor layer by at least 0.1 eV,
the second acceptor layer has a lowest unoccupied molecular orbital (LUMO) energy that is within 0.1 eV of a LUMP energy of the first acceptor layer,
an optical emission spectrum of the second acceptor layer overlaps with an optical absorption spectrum of the first acceptor layer, a charge-transfer state energy at an interface between the first acceptor layer and the second acceptor layer is smaller than a triplet state energy of one or both of the first acceptor layer and the second acceptor layer, and
a paired combination of the first acceptor layer and the second acceptor layer is boron subnaphthalocyanine chloride/boron subphathalocyanine chloride, and
wherein when the second donor layer is present:
the second donor layer has an optical band gap that is greater than an optical band gap of the first donor layer by at least 0.1 eV,
the second donor layer has a highest occupied molecular orbital (HOMO) energy that is within 0.1 eV of a HOMO energy of the first donor layer,
an optical emission spectrum of the second donor layer overlaps with an optical absorption spectrum of the first donor layer, a charge-transfer state energy at an interface between the first donor layer and the second donor layer is smaller than a triplet state energy of one or both of the first donor layer and the second donor layer, and
a paired combination the first donor layer and second donor layer is selected from the group consisting of alpha-sexithiophene/copper phtalocyanine, alpha-sexithiophene/zinc phtalocyanine, alpha-sexithiophene/lead phtalocyanine.

3. An organic photovoltaic cell, comprising:
a first organic donor layer and a first organic acceptor layer contacting the first organic donor layer to form a heterojunction; and
a second acceptor layer adjacent the first acceptor layer with or without a second donor layer adjacent the first donor layer,
wherein the second acceptor layer is such that:
wherein the second acceptor layer has an optical band gap that is greater than an optical band gap of the first acceptor layer by at least 0.1 eV,
the second acceptor layer has a lowest unoccupied molecular orbital LUMO) energy that is within 0.1 eV of a LUMO energy of the first acceptor layer,
an optical emission spectrum of the second acceptor layer overlaps with an optical absorption spectrum of the first acceptor layer, a charge-transfer state energy at an interface between the first acceptor layer and the second acceptor layer is smaller than a triplet state energy of one or both of the first acceptor layer and the second acceptor layer, and
a paired combination of the first acceptor layer and the second acceptor layer is selected from the group consisting of chloroaluminium phthalocyanine/subphthalocyanine, zinc phthalocyanine/subphthalocyanine, lead phthalocyanine/subphthalocyanine, and lead phthalocyanine/subnaphthalocyanine, and wherein when the second donor layer is present:

the second donor layer has an optical band gap that is greater than an optical band gap of the first donor layer by at least 0.1 eV, the second donor layer has a highest occupied molecular orbital (HOMO) energy that is within 0.1 eV of a HOMO energy of the first donor layer, an optical emission spectrum of the second donor layer overlaps with an optical absorption spectrum of the first donor layer, a charge-transfer state energy at an interface between the first donor layer and the second donor layer is smaller than a triplet state energy of one or both of the first donor layer and the second donor layer, and a paired combination the first donor layer and second donor layer is selected from the group consisting of alpha-sexithiophene/copper phtalocyanine, alphasexithiophene/zinc phtalocyanine, alpha-sexithiophene/lead phtalocyanine, pentacene/copper phtalocyanine, pentacene/zinc phtalocyanine pentacene/lead phtalocyanine, rubrene/subphtalocyanine, and rubrene/subnaphthalocyanine.

4. An organic photovoltaic cell, comprising:
a first organic donor layer and a first organic acceptor layer contacting the first organic donor layer to form a heterojunction; and
a second donor layer adjacent the first donor layer and a second acceptor layer adjacent the first acceptor layer,
wherein the second acceptor layer is such that:
the second acceptor layer has an optical band gap that is greater than an optical band gap of the first acceptor layer by at least 0.1 eV,
the second acceptor layer has a lowest unoccupied molecular orbital (LUMO) energy that is within 0.1 eV of a LUMO energy of the first acceptor layer,
an optical emission spectrum of the second acceptor layer overlaps with an optical absorption spectrum of the first acceptor layer a charge-transfer state energy at an interface between the first acceptor layer and the second acceptor layer is smaller than a triplet state energy of one or both of the first acceptor layer and the second acceptor layer, and
a paired combination of the first acceptor layer and the second acceptor layer is selected from the group consisting of chloroaluminium phthalocyanine/subphthalocyanine, zinc phthalocyanine/subphthalocyanine, lead phthalocyanine/subphthalocyanine, lead phthalocyanine/subnaphthalocyanine, and boron subnaphthalocyanine chloride/boron subphathalocyanine chloride, and wherein the second donor layer is such that:
the second donor layer has an optical band gap that is greater than an optical band gap of the first donor layer by at least 0.1 eV,
the second donor layer has a highest occupied molecular orbital (HOMO) energy that is within 0.1 eV of a HOMO energy of the first donor layer, an optical emission spectrum of the second donor layer overlaps with an optical absorption spectrum of the first donor layer, a charge-transfer state energy at an interface between the first donor layer and the second donor layer is smaller than a triplet state energy of one or both of the first donor layer and the second donor layer, and a paired combination the first donor layer and second donor layer is selected from the group consisting of alpha-sexithiophene/copper phtalocyanine, alphasexithiophene/zinc phtalocyanine, alpha-sexithiophene/lead phtalocyanine, pentacene/copper phtalocyanine, pentacene/zinc phtalocyanine pentacene/lead phtalocyanine, rubrene/subphtalocyanine, and rubrene/subnaphthalocyanine.

5. An organic photovoltaic cell, comprising:
a first organic donor layer and a first organic acceptor layer contacting the first organic donor layer to form a heterojunction; and
a second acceptor layer adjacent the first acceptor layer with or without a second donor layer adjacent the first donor layer,
wherein the second acceptor layer is such that:
has an optical band gap that is greater than an optical band gap of the first acceptor layer by at least 0.1 eV,
the second acceptor layer has a lowest unoccupied molecular orbital (LUMO) energy that is within 0.1 eV of a LUMO energy of the first acceptor layer,
an optical emission spectrum of the second acceptor layer overlaps with an optical absorption spectrum of the first acceptor layer, a charge-transfer state energy at an interface between the first acceptor layer and the second acceptor layer is smaller than a triplet state energy of one or both of the first acceptor layer and the second acceptor layer, and
a paired combination of the first acceptor layer and the second acceptor layer is boron subnaphthalocyanine chloride/boron subphathalocyanine chloride; and
wherein when the second donor layer is present:
the second donor layer has an optical band gap that is greater than an optical band gap of the first donor layer by at least 0.1 eV,
the second donor layer has a highest occupied molecular orbital (HOMO) energy that is within 0.1 eV of a HOMO energy of the first donor layer,
an optical emission spectrum of the second donor layer overlaps with an optical absorption spectrum of the first donor layer, and
a charge-transfer state energy at an interface between the first donor layer and the second donor layer is smaller than a triplet state energy of one or both of the first donor layer and the second donor layer,
a paired combination the first donor layer and second donor layer is selected from the group consisting of alpha-sexithiophene/copper phtalocyanine, alphasexithiophene/zinc phtalocyanine, and alpha-sexithiophene/lead phtalocyanine.

* * * * *

UNITED STATES PATENT AND TRADEMARK OFFICE
CERTIFICATE OF CORRECTION

PATENT NO. : 10,468,615 B2
APPLICATION NO. : 15/004724
DATED : November 5, 2019
INVENTOR(S) : Barry Rand It is certified that error appears in the above-identified patent and that said Letters Patent is hereby corrected as shown below:

On the Title Page

On Page 2, in Column 2, Item (56), Line 6, under Other Publications, delete "$C_{603}$" and insert --$C_{60}$--.

In the Drawings

In Sheet 4 of 5, FIG. 7, Line 3 (Approx.), delete "a6T" and insert --$\alpha$-6T--.

In the Specification

In Column 7, Line 18, after "A2." delete "[0042]".

In the Claims

In Column 12, Line 15, Claim 2, delete "LUMP" and insert --LUMO--.

In Column 12, Line 25, Claim 2, delete "subphathalocyanine" and insert --subphthalocyanine--.

In Column 12, Line 40, Claim 2, after "combination" insert --of--.

In Column 12, Line 42, Claim 2, delete "phtalocyanine" and insert --phthalocyanine--.

In Column 12, Line 43, Claim 2, delete "phtalocyanine" and insert --phthalocyanine--.

In Column 12, Line 44, Claim 2, delete "phtalocyanine" and insert --phthalocyanine--.

In Column 12, Line 57, Claim 3, delete "LUMO)" and insert --(LUMO)--.

In Column 13, Line 19, Claim 3, after "combination" insert --of--.

Signed and Sealed this
Third Day of March, 2020

Andrei Iancu
*Director of the United States Patent and Trademark Office*

CERTIFICATE OF CORRECTION (continued)
U.S. Pat. No. 10,468,615 B2

In Column 13, Line 21, Claim 3, delete "phtalocyanine" and insert --phthalocyanine--.

In Column 13, Line 22, Claim 3, delete "alphasexithiophene" and insert --alpha-sexithiophene--.

In Column 13, Line 22, Claim 3, delete "phtalocyanine" and insert --phthalocyanine--.

In Column 13, Line 23, Claim 3, delete "phtalocyanine" and insert --phthalocyanine--.

In Column 13, Line 24, Claim 3, delete "phtalocyanine" and insert --phthalocyanine--.

In Column 13, Line 24, Claim 3, delete "phtalocyanine" and insert --phthalocyanine,--.

In Column 13, Line 25, Claim 3, delete "phtalocyanine" and insert --phthalocyanine--.

In Column 13, Line 25, Claim 3, delete "subphtalocyanine" and insert --subphthalocyanine--.

In Column 13, Line 42, Claim 4, delete "layer" and insert --layer,--.

In Column 13, Lines 53-54, Claim 4, delete "subphathalocyanine" and insert --subphthalocyanine--.

In Column 14, Line 8, Claim 4, after "combination" insert --of--.

In Column 14, Line 10, Claim 4, delete "phtalocyanine" and insert --phthalocyanine--.

In Column 14, Line 11, Claim 4, delete "alphasexithiophene" and insert --alpha-sexithiophene--.

In Column 14, Line 11, Claim 4, delete "phtalocyanine" and insert --phthalocyanine--.

In Column 14, Line 12, Claim 4, delete "phtalocyanine" and insert --phthalocyanine--.

In Column 14, Line 13, Claim 4, delete "phtalocyanine" and insert --phthalocyanine--.

In Column 14, Line 13, Claim 4, delete "phtalocyanine" and insert --phthalocyanine,--.

In Column 14, Line 14, Claim 4, delete "phtalocyanine" and insert --phthalocyanine--.

In Column 14, Line 14, Claim 4, delete "subphtalocyanine" and insert --subphthalocyanine--.

In Column 14, Line 40, Claim 5, delete "subphathalocyanine" and insert --subphthalocyanine--.

In Column 14, Line 56, Claim 5, after "combination" insert --of--.

In Column 14, Line 58, Claim 5, delete "phtalocyanine" and insert --phthalocyanine--.

In Column 14, Line 59, Claim 5, delete "alphasexithiophene" and insert --alpha-sexithiophene--.

In Column 14, Line 59, Claim 5, delete "phtalocyanine" and insert --phthalocyanine--.

In Column 14, Line 60, Claim 5, delete "phtalocyanine" and insert --phthalocyanine--.